(12) United States Patent
Kato et al.

(10) Patent No.: US 9,973,718 B2
(45) Date of Patent: May 15, 2018

(54) SOLID-STATE IMAGING ELEMENT, METHOD OF DRIVING THE SAME, AND CAMERA SYSTEM

(71) Applicant: Sony Corporation, Tokyo (JP)

(72) Inventors: Yuichi Kato, Kanagawa (JP); Yoshikazu Nitta, Tokyo (JP); Noriyuki Fukushima, Kanagawa (JP); Takashi Suenaga, Tokyo (JP); Toshiyuki Sugita, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days. days.

(21) Appl. No.: 15/251,229

(22) Filed: Aug. 30, 2016

(65) Prior Publication Data

US 2016/0373677 A1  Dec. 22, 2016

Related U.S. Application Data

(63) Continuation of application No. 14/812,783, filed on Jul. 29, 2015, now Pat. No. 9,497,401, which is a (Continued)

(30) Foreign Application Priority Data

Oct. 9, 2008 (JP) .................... 2008-263159

(51) Int. Cl.
*H04N 5/374* (2011.01)
*H04N 5/3745* (2011.01)
(Continued)

(52) U.S. Cl.
CPC ..... *H04N 5/3742* (2013.01); *H01L 27/14609* (2013.01); *H01L 27/14614* (2013.01);
(Continued)

(58) Field of Classification Search
CPC ............... H04N 5/3742; H04N 5/3698; H04N 5/37455; H04N 5/347; H04N 5/37457;
(Continued)

(56) References Cited

U.S. PATENT DOCUMENTS 6,794,627 B2  9/2004 Lyon et al.
6,992,714 B1  1/2006 Hashimoto et al.
(Continued)

FOREIGN PATENT DOCUMENTS

JP  2001-292453  10/2001
JP  2004-215048  7/2004
(Continued)

OTHER PUBLICATIONS

PCT International Search Report issued in connection with counterpart PCT Application No. PCT/JP2009/066120 dated Oct. 9, 2008.
(Continued)

*Primary Examiner* — Mekonnen Dagnew
(74) *Attorney, Agent, or Firm* — Dentons US LLP

(57) ABSTRACT

A solid-state imaging element including pixel signal read lines, and a pixel signal reading unit for reading pixel signals from a pixel unit via the pixel signal read line. The pixel unit includes a plurality of pixels arranged in a matrix form, each pixel including a photoelectric conversion element. In the pixel unit, a shared pixel in which an output node is shared among a plurality of pixels is formed, and a pixel signal of each pixel in the shared pixel is capable of being selectively output from the shared output node to a corresponding one of the pixel signal read lines. The pixel signal reading unit sets a bias voltage for a load element which is connected to the pixel signal read line and in which current dependent on a bias voltage flows in the load element, to a voltage causing a current value to be higher than current upon a reference (Continued)

bias voltage when there is no difference between added charge amounts, when addition of pixel signals of the respective pixels in the shared pixel is driven.

4 Claims, 18 Drawing Sheets

Related U.S. Application Data continuation of application No. 14/288,032, filed on May 27, 2014, now Pat. No. 9,160,954, which is a continuation of application No. 13/122,317, filed as application No. PCT/JP2009/066120 on Sep. 16, 2009, now Pat. No. 8,773,557.

(51) Int. Cl.
  *H01L 27/146* (2006.01)
  *H04N 5/347* (2011.01)
  *H04N 5/378* (2011.01)
  *H04N 5/369* (2011.01)

(52) U.S. Cl.
  CPC .. *H01L 27/14641* (2013.01); *H01L 27/14643* (2013.01); *H04N 5/347* (2013.01); *H04N 5/3698* (2013.01); *H04N 5/378* (2013.01); *H04N 5/37455* (2013.01); *H04N 5/37457* (2013.01)

(58) Field of Classification Search
  CPC .............. H04N 5/378; H01L 27/14643; H01L 27/14614; H01L 27/14641; H01L 27/14609
  See application file for complete search history.

(56) References Cited

U.S. PATENT DOCUMENTS

| | | | |
|---|---|---|---|
| 2003/0218680 A1* | 11/2003 | Shiohara | H04N 9/045 348/308 |
| 2005/0285961 A1 | 12/2005 | Kokubo et al. | |
| 2007/0018072 A1 | 1/2007 | Koh et al. | |
| 2007/0045552 A1* | 3/2007 | Masazumi | G01T 1/244 250/370.09 |
| 2007/0139544 A1 | 6/2007 | Egawa et al. | |
| 2007/0194962 A1 | 8/2007 | Asayama et al. | |
| 2007/0235631 A1* | 10/2007 | Ladd | H04N 5/3575 250/208.1 |
| 2007/0285548 A1 | 12/2007 | Gomi | |
| 2008/0043128 A1 | 2/2008 | Poonnen et al. | |
| 2008/0259193 A1* | 10/2008 | Toya | H04N 5/217 348/300 |
| 2010/0002117 A1 | 1/2010 | Iwane et al. | |
| 2011/0221941 A1 | 9/2011 | Sato | |
| 2012/0013780 A1 | 1/2012 | Mo et al. | |

FOREIGN PATENT DOCUMENTS

| | | |
|---|---|---|
| JP | 2007-059991 | 3/2007 |
| JP | 2007-173950 | 7/2007 |
| WO | WO/03/036940 | 5/2003 |

OTHER PUBLICATIONS

European Search Report issued in connection with counterpart European Patent Application No. EP 09819075 dated May 11, 2012.

* cited by examiner

EXAMPLE OF 2x2 PIXEL SHARED PIXEL CONFIGURATION

TIMING CHART FOR SOURCE FOLLOWER ADDITION DRIVE

LINEARITY CHARACTERISTIC OF SOURCE FOLLOWER

I/O LINEARITY CHARACTERISTIC OF RGB

SOURCE FOLLOWER ADDITION DRIVING METHOD
IN RGB 2x2 PIXEL SHARED PIXEL ARRAY

SOURCE FOLLOWER ADDITION DRIVING METHOD
IN RGB 2x2 PIXEL SHARED PIXEL ARRAY

SOURCE FOLLOWER ADDITION DRIVING METHOD
IN RGB 4x4 PIXEL SHARED PIXEL ARRAY

SOURCE FOLLOWER ADDITION DRIVING METHOD
IN RGB 4x4 PIXEL SHARED PIXEL ARRAY

SOURCE FOLLOWER ADDITION DRIVING METHOD
IN RGB 2x2 ZIGZAG PIXEL SHARED PIXEL ARRAY

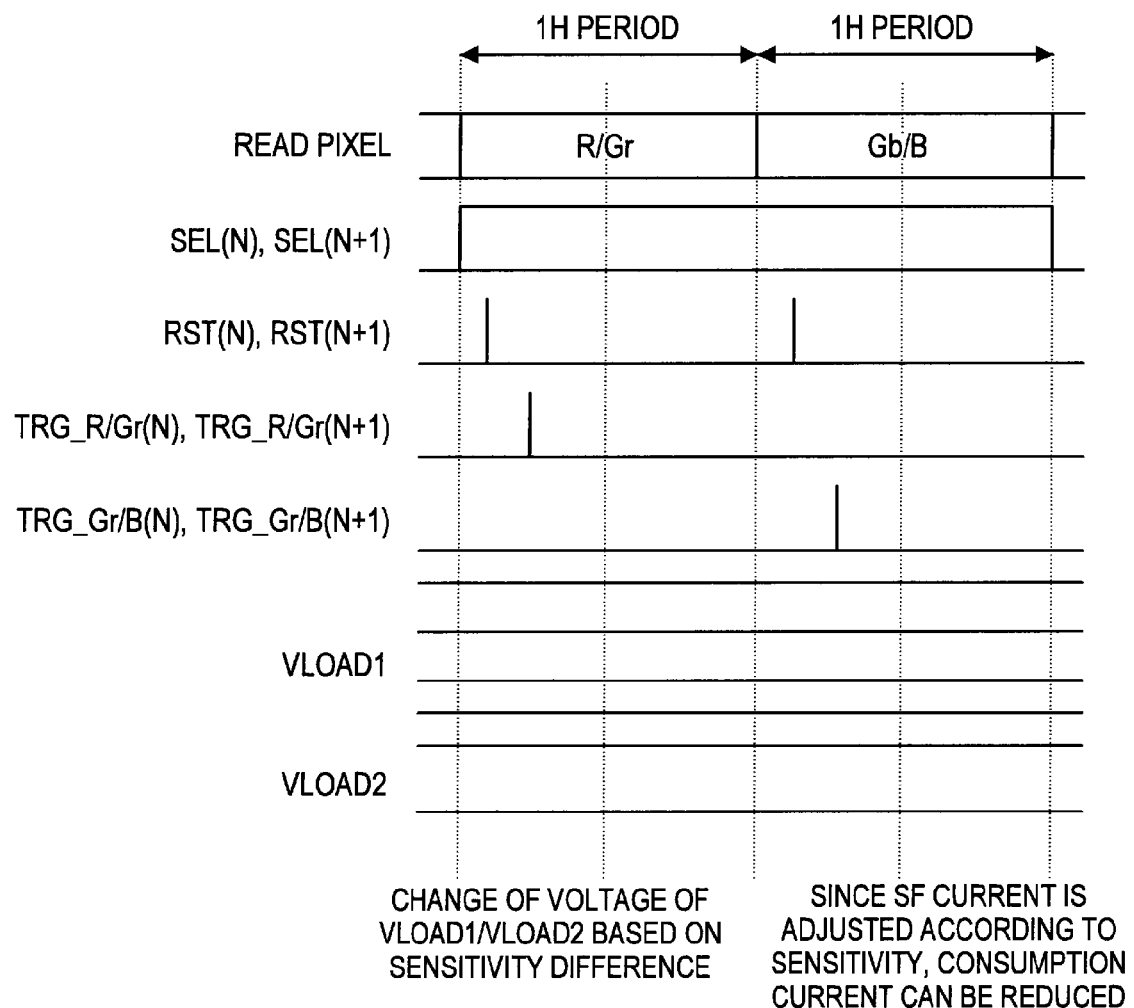

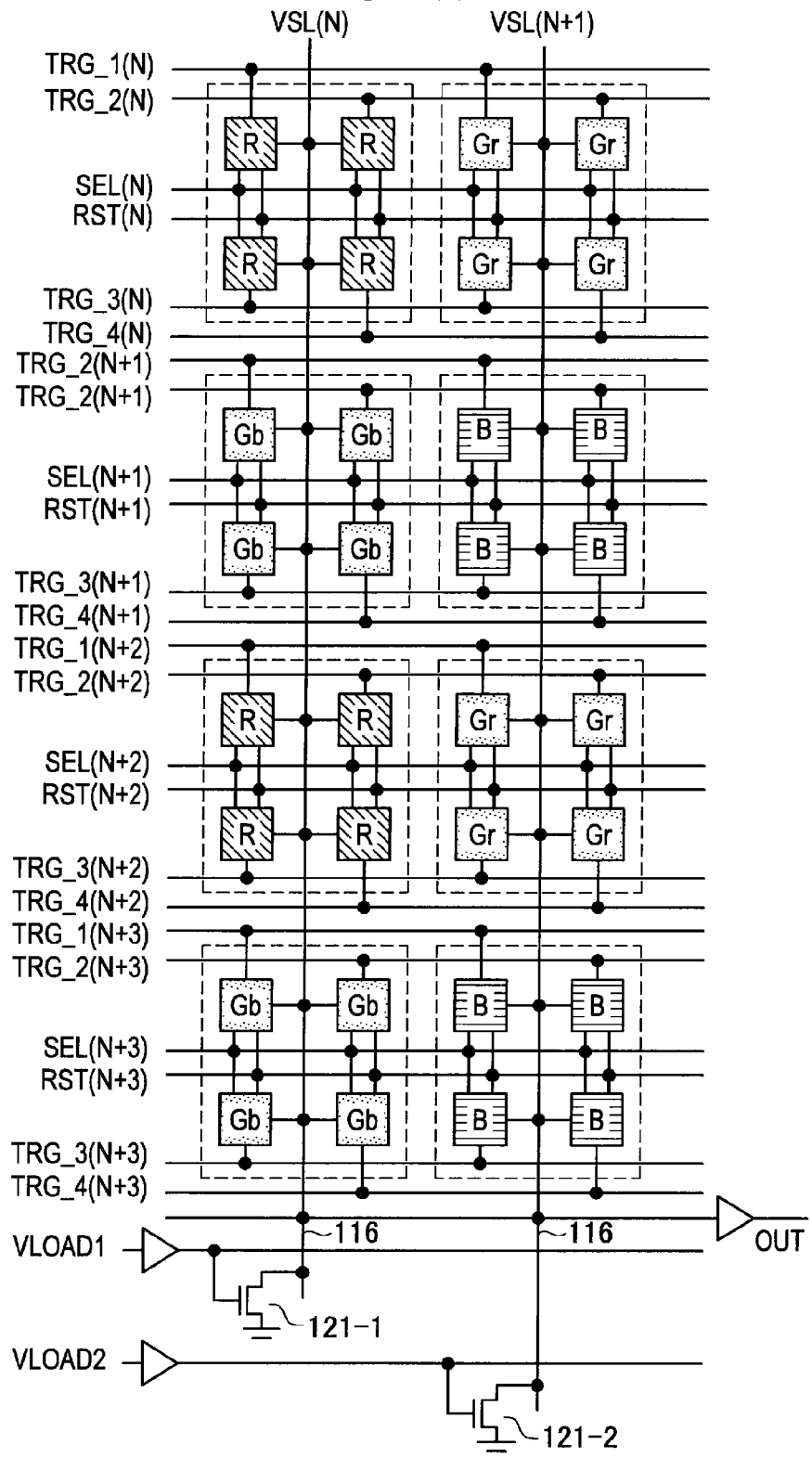
SOURCE FOLLOWER ADDITION DRIVING METHOD
IN RGB 2x2 PIXEL SHARED PIXEL ARRAY

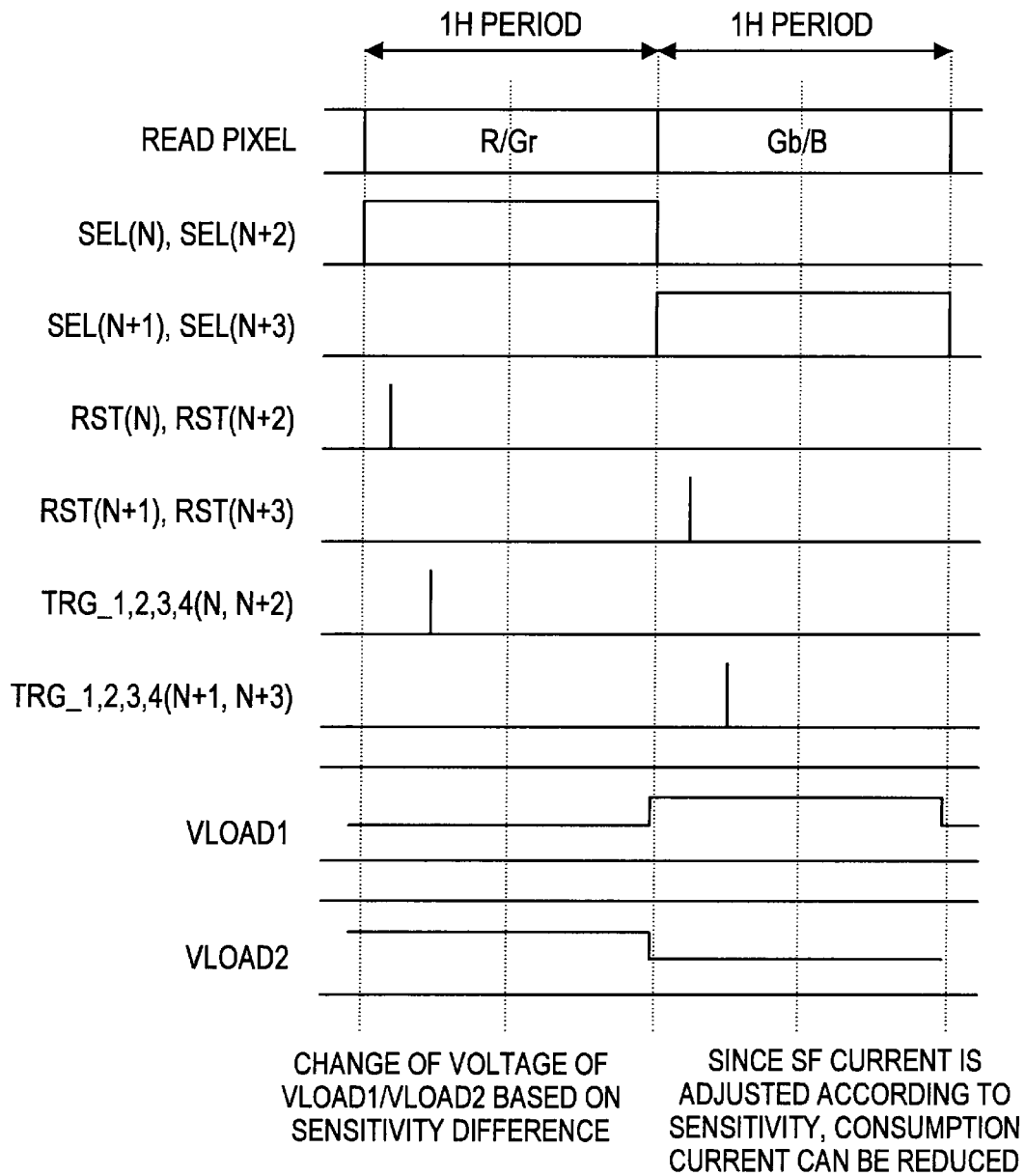

FIG.13

| ADD CHARGE AMOUNT DIFFERENCE (HOLE/ELECTRON) | LOAD MOS GATE APPLIED VOLTAGE (V) | CONTROL VALUE FOR Bias CIRCUIT |
|---|---|---|
| 0 | 0.60 | 0 |
| 200 | 0.65 | 1 |
| 400 | 0.70 | 2 |
| 600 | 0.75 | 3 |
| 800 | 0.80 | 4 |
| 1000 | 0.85 | 5 |
| 1200 | 0.90 | 6 |
| 1400 | 0.95 | 7 |
| 1600 | 1.00 | 8 |

TABLE OF ADDED CHARGE AMOUNT DIFFERENCE AND LOAD MOS VOLTAGE NECESSARY FOR LINEARITY MAINTENANCE

SOLID-STATE IMAGING ELEMENT, METHOD OF DRIVING THE SAME, AND CAMERA SYSTEM

RELATED APPLICATION DATA

This application is a continuation of U.S. patent application Ser. No. 14/812,783 filed Jul. 29, 2015, which is a continuation of U.S. patent application Ser. No. 14/288,032 filed May 27, 2014, now U.S. Pat. No. 9,160,954 issued on Oct. 13, 2015, which is a continuation of U.S. patent application Ser. No. 13/122,317 filed Apr. 1, 2011, now U.S. Pat. No. 8,773,557 issued Jul. 8, 2014, which is a 371 filing of International Patent Application No. PCT/JP2009/066120 filed on Sep. 16, 2009, the entireties of which are incorporated herein by reference to the extent permitted by law. The present application claims the benefit of priority to Japanese Patent Application No. JP 2008-263159 filed on Oct. 9, 2008 in the Japan Patent Office, the entirety of which is incorporated by reference herein to the extent permitted by law.

TECHNICAL FIELD

The present invention relates to a solid-state imaging element represented by a CMOS image sensor, a method of driving the same, and a camera system.

BACKGROUND ART

In recent years, a CMOS image sensor has attracted attention as a solid-state imaging element (image sensor) that is an alternative to a CCD. This is for the following reasons.

A dedicated process is necessary to fabricate a CCD pixel. A plurality of power supply voltages are necessary for operation of the CCD pixel, and a plurality of peripheral ICs need to be combined and operated.

On the other hand, a CMOS image sensor overcomes a problem of a very complicated system in such a CCD.

The same fabrication process as for a typical CMOS integrated circuit can be used to fabricate the CMOS image sensor, which can be driven by a single power supply, and also both an analog circuit and a logic circuit using a CMOS process are incorporated in the same chip.

Thereby, the CMOS image sensor has great merits of the number of peripheral ICs being reduced.

An output circuit for the CCD is mainly a 1-channel (ch) output using a floating diffusion (FD) amplifier with an FD layer.

On the other hand, the CMOS image sensor has an FD amplifier for each pixel, and an output of the CMOS image sensor is mainly a column-parallel output in which any one row in a pixel array is selected and pixels on the row are simultaneously read in a column direction.

This is because it is difficult to obtain sufficient driving capability from an FD amplifier arranged in the pixel and accordingly a data rate needs to be lowered and parallel processing is advantageous.

Here, in such a solid-state imaging element, a unit cell size of a pixel becomes smaller with multiple pixels and miniaturization.

Accordingly, in the solid-state imaging element, a percentage of an area of a transistor in the pixel increases and an area of a photodiode (PD) becomes small, such that a saturation charge amount and sensitivity are degraded and image quality is deteriorated.

Further, high-speed reading in a number of pixels, such as 30 fps realization in an HD mode, is necessary.

Thereby, in a solid-state imaging element including pixels having a small unit cell size, methods of adding some pixel signals in an analog or digital manner for enhancement of sensitivity and S/N or high-speed reading have been proposed.

One method is a method in which an FD is shared among a plurality of pixels and charges obtained through photo-electrical conversion in each pixel are added at the FD.

However, if the FD is formed to add the same color pixels while a unit cell size of the pixel is being reduced, the PD area is further reduced, leading to degradation of a saturation charge amount and sensitivity and deterioration of image quality.

Another addition method is a method of performing conversion into a digital signal and then addition in a solid-state imaging element with an analog digital (AD) converter.

In an all-pixel mode, one AD conversion is performed in a certain period. However, when digital addition is performed to realize high speed, a plurality of AD conversions are necessary in the certain period, and there are issues of a need for fast AD conversion and generation of noise due to the fast AD conversion.

A source follower addition in which a load MOS circuit connected to a read signal line performs addition is known as a method capable of avoiding issues caused by the FD addition and the digital addition and realizing enhancement of sensitivity and S/N and high speed (e.g., see Patent Literature 1).

CITATION LIST

Patent Literature

Patent Literature 1: U.S. Pat. No. 6794627 B2

SUMMARY OF INVENTION

Technical Problem

In source follower addition in which a plurality of pixel signals are simultaneously read to a read line, the read signal amount becomes an average value of the added pixel charge amounts when added pixel charge amounts are similar with each other.

However, when there is a great difference between the added pixel charge amounts, each of the signal amounts added by the source follower is not equal to the average value, but is a signal amount smaller than the average value.

Thereby, the source follower addition causes false color, for example, in edges where contrast is distinct.

In Patent Literature 1, a plurality of pixels are added to cope with application of colors at the edges.

However, the method of adding pixels on a plurality of columns to cope with the application of colors at the edges suffers from resolution degradation.

The present invention aims to provide a solid-state imaging element, a method of driving the same, and a camera system capable of preventing degradation of resolution while suppressing generation of false colors.

Solution to Problem

According to the first aspect of the present invention, there is provided a solid-state imaging element including:

pixel signal read lines; a pixel unit including a plurality of pixels arranged in a matrix form, each pixel including a photoelectric conversion element; and a pixel signal reading unit for reading pixel signals from the pixel unit via the pixel signal read lines, wherein in the pixel unit, a shared pixel in which an output node is shared among a plurality of pixels is formed, and a pixel signal of each pixel in the shared pixel is capable of being selectively output from the shared output node to a corresponding one of the pixel signal read lines, the pixel signal reading unit includes a load element which is connected to the pixel signal read line to function as a current source and in which current dependent on a bias voltage flows, and when addition of pixel signals of the respective pixels in the shared pixel is driven, the bias voltage for the load element is capable of being set to a voltage causing a current value to be higher than current upon a reference bias voltage when there is no difference between added charge amounts.

According to the second aspect of the present invention, there is provided a method of driving a solid-state imaging element, the method including: forming a shared pixel in which an output node is shared among a plurality of pixels each including a photoelectric conversion element; selectively outputting a pixel signal of each pixel in the shared pixel from the shared output node to a corresponding one of the pixel signal read lines; and setting a bias voltage for a load element which is connected to the pixel signal read line to function as a current source and in which current dependent on a bias voltage flows, to a voltage causing a current value to be higher than current upon a reference bias voltage when there is no difference between added charge amounts, when addition of pixel signals of the respective pixels in the shared pixel is driven.

According to the third aspect of the present invention, there is provided a camera system including: a solid-state imaging element; and an optical system for imaging a subject image on the imaging element, wherein the solid-state imaging element includes: pixel signal read lines; a pixel unit including a plurality of pixels arranged in a matrix form, each pixel including a photoelectric conversion element; and a pixel signal reading unit for reading pixel signals from the pixel unit via the pixel signal read lines, and wherein in the pixel unit, a shared pixel in which an output node is shared among a plurality of pixels is formed, and a pixel signal of each pixel in the shared pixel is capable of being selectively output from the shared output node to a corresponding one of the pixel signal read lines, the pixel signal reading unit includes a load element which is connected to the pixel signal read line to function as a current source and in which current dependent on a bias voltage flows, and when addition of pixel signals of the respective pixels in the shared pixel is driven, the bias voltage for the load element is capable of being set to a voltage causing a current value to be higher than current upon a reference bias voltage when there is no difference between added charge amounts.

According to the present invention, when addition of pixel signals of pixels in the shared pixel is driven, the bias voltage for the load element is set to a voltage causing a current value to be higher than current upon a reference bias voltage when there is no difference between the added charge amounts.

Advantageous Effects of Invention

According to the present invention, it is possible to prevent degradation of resolution while suppressing generation of false colors.

BRIEF DESCRIPTION OF DRAWINGS

FIG. 11B is a diagram for explaining the third method of driving source follower addition of the second embodiment, which is a method of driving source follower addition in a 2×2 pixels zigzag pixel shared pixel array.

FIG. 12A is a diagram for explaining a fourth method of driving source follower addition of the second embodiment, which is a method of driving source follower addition in the same color 2×2 pixel shared pixel array.

FIG. 12B is a diagram for explaining the fourth method of driving source follower addition of the second embodiment, which is a method of driving source follower addition in the same color 2×2 pixel shared pixel array.

FIG. 13 is a diagram showing a relationship among a difference between added charge amounts, a gate voltage of a load MOS transistor necessary for linearity maintenance, and a control value.

DESCRIPTION OF EMBODIMENTS

Hereinafter, embodiments of the present invention will be described with reference to the accompanying drawings.

Further, a description will be given in the following order.
1. First Embodiment (First Configuration Example of Solid-state Imaging Element)
2. Second Embodiment (Second Configuration Example of Solid-state Imaging Element)
3. Third Embodiment (Configuration Example of Camera System)

<First Embodiment>

Figure 1:
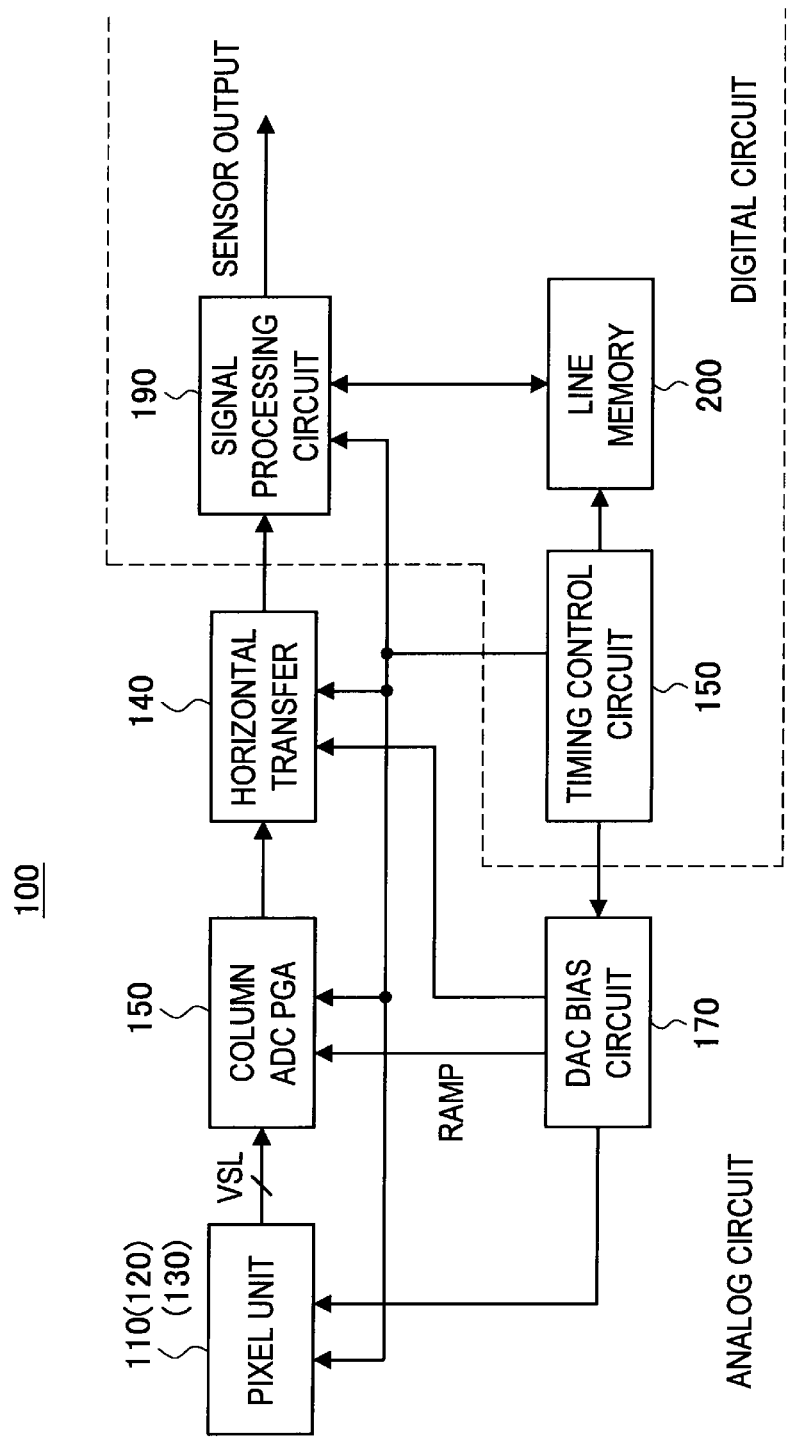
FIG. 1 is a block diagram showing a configuration example of a solid-state imaging element (CMOS image sensor) with a column-parallel ADC according to an embodiment of the present invention.

FIG. 1 is a block diagram showing a configuration example of a solid-state imaging element (CMOS image sensor) with a column-parallel ADC according to an embodiment of the present invention.

Figure 2:
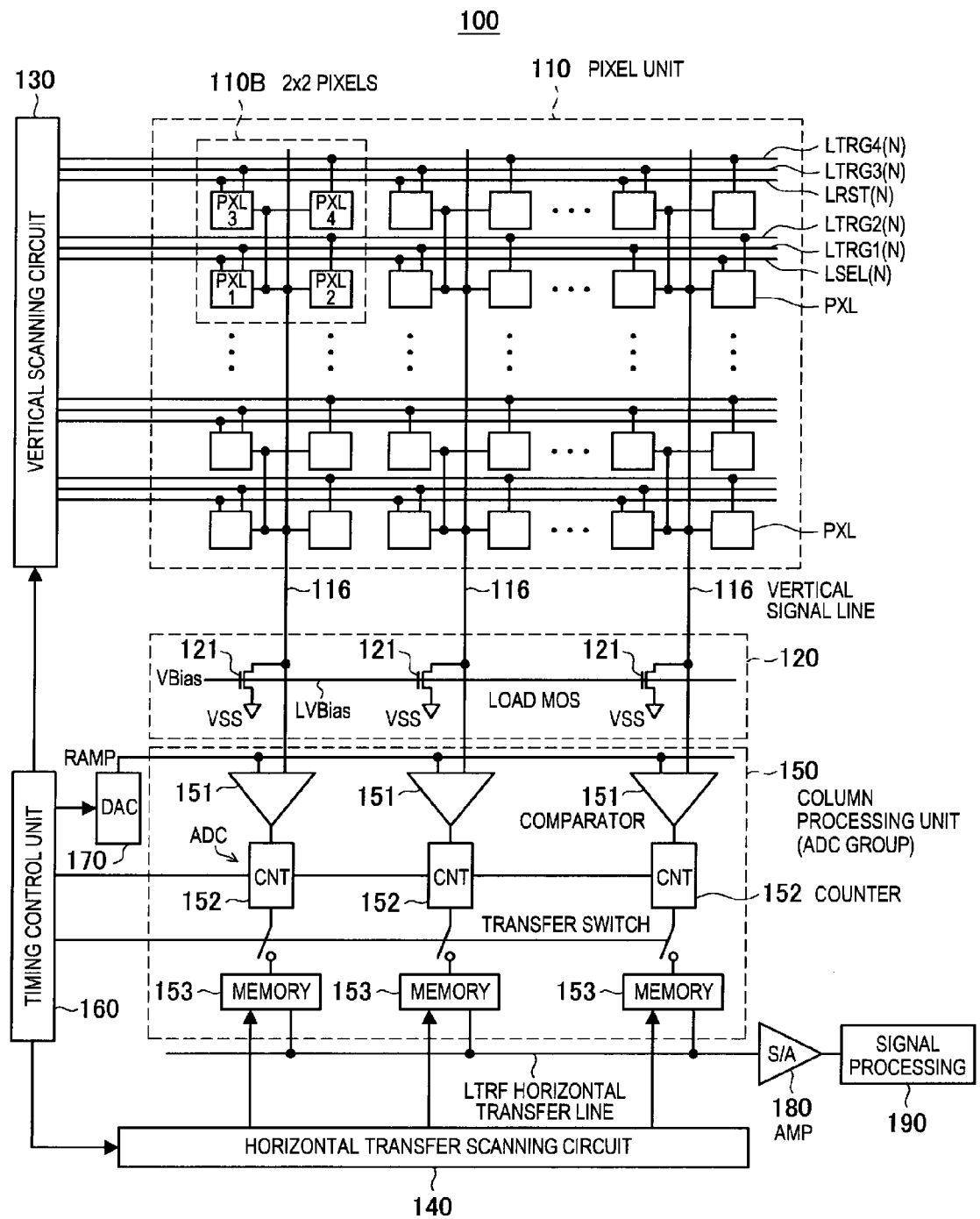
FIG. 2 is a block diagram specifically showing pixels and an ADC group in a solid-state imaging element (CMOS image sensor) with a column-parallel ADC according to the first embodiment in which an FD is shared among 4 pixels.

FIG. 2 is a block diagram more specifically showing pixels and an ADC group in a solid-state imaging element (CMOS image sensor) with a column-parallel ADC in which an FD is shared among 4 pixels according to the first embodiment.

This solid-state imaging element 100 includes a pixel unit 110, a load MOS unit 120, a vertical scanning circuit 130, a horizontal transfer scanning circuit 140, a column processing unit (ADC group) 150 as a pixel signal reading unit, and a timing control unit 150, as shown in FIGS. 1 and 2.

The solid-state imaging element 100 includes a digital-analog conversion device (DAC) and bias circuit 170 including a DAC, an amplifier circuit (S/A) 180, a signal processing circuit 190, and a line memory 200.

Among theses components, the pixel unit 110, the load MOS unit 120, the vertical scanning circuit 130, the horizontal transfer scanning circuit 140, the ADC group 150, the DAC 170, and the amplifier circuit (S/A) 180 are configured of an analog circuit.

Further, the timing control unit 160, the signal processing circuit 190, and the line memory 200 are configured of a digital circuit.

The pixel unit 110 includes pixels PXL, each including a photodiode (PD) as a photoelectric conversion element, arranged in a matrix form.

The pixel unit 110 of the present embodiment has a configuration in which the FD is shared among 4 pixels. Here, a basic pixel configuration will be described and then the configuration in which the FD is shared among 4 pixels will be described.

[Example of Basic Configuration of Pixel]

Figure 3:
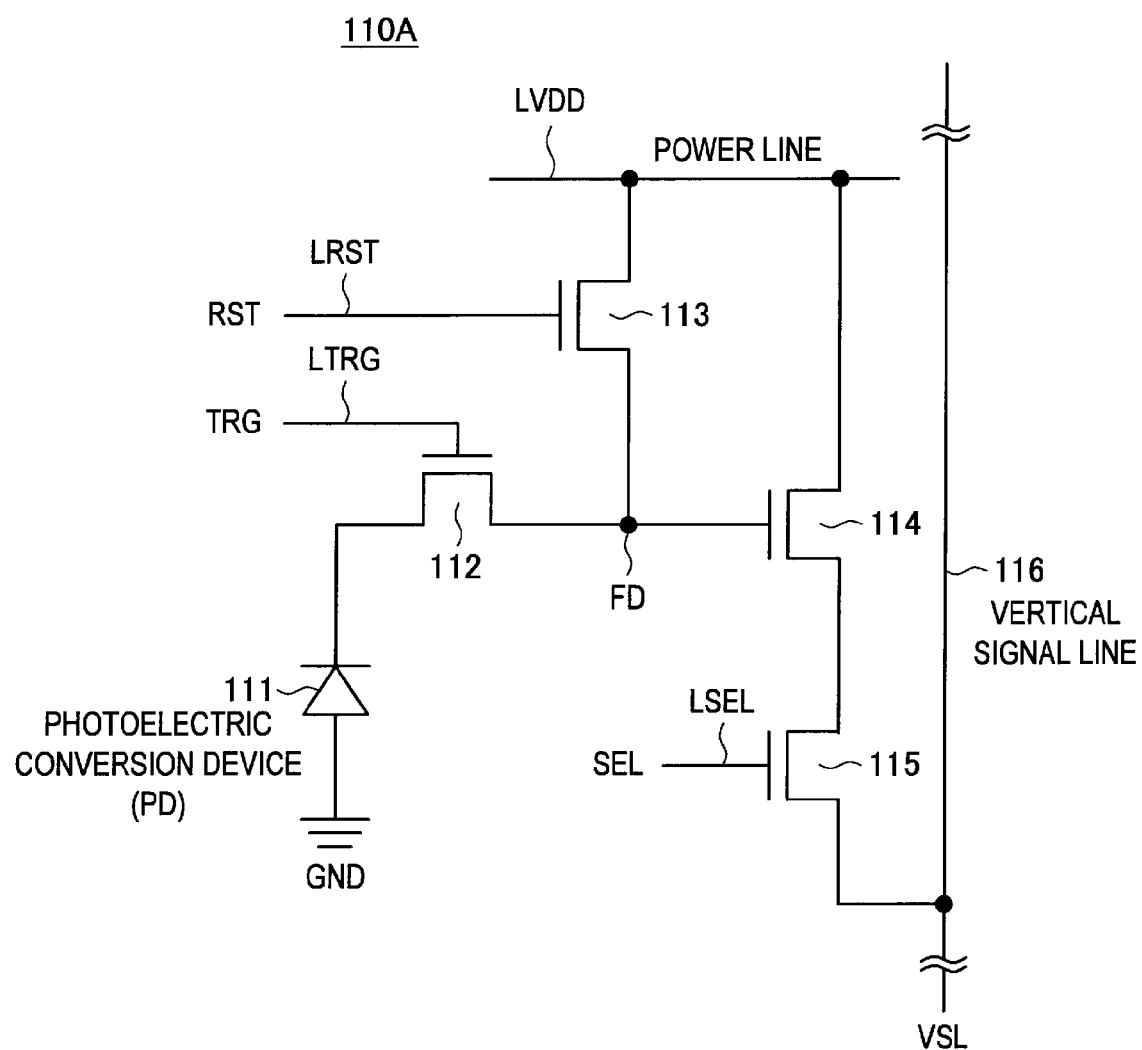
FIG. 3 is a diagram showing one example of a basic pixel circuit of a CMOS image sensor including four transistors according to the present embodiment.

FIG. 3 is a diagram showing one example of a basic pixel circuit of a CMOS image sensor including four transistors according to the present embodiment.

The pixel circuit 110A of FIG. 3 includes, for example, a PD 111 as a photoelectric conversion element.

The pixel circuit 110A includes a PD 111 as one photoelectric conversion element.

The pixel circuit 110A includes, for one PD 111, four transistors as active elements: a transfer transistor 112 as a transfer element, a reset transistor 113 as a resetting element, an amplifying transistor 114, and a selecting transistor 115.

The PD 111 photoelectrically converts incident light into charges (herein, electrons) of an amount dependent on a light amount of the incident light.

The transfer transistor 112 is connected between the PD 111 and an FD as an output node.

As a transfer signal TRG is applied to a gate (transfer gate) of the transfer transistor 112 via a transfer control line LTRG, the transfer transistor 112 transfers the electrons, which are obtained through photoelectrical conversion in the PD 111, to the FD.

The reset transistor 113 is connected between a power line LVDD and the FD.

As a reset signal RST is applied to a gate of the reset transistor 113 via a reset control line LRST, the reset transistor 113 resets a potential of the FD to a potential of the power line LVDD.

A gate of the amplifying transistor 114 is connected to the FD. The amplifying transistor 114 is connected to a vertical signal line 116 via the selecting transistor 115 and forms a source follower in cooperation with a load MOS, which forms a constant current source outside the pixel unit.

A control signal (address signal or select signal) SEL is applied to a gate of the selecting transistor 115 via a select control line LSEL, so that the selecting transistor 115 is turned on.

When the selecting transistor 115 is turned on, the amplifying transistor 114 amplifies the potential of the FD and outputs a voltage dependent on the potential to the vertical signal line 116. The voltage output from each pixel via the vertical signal line 116 is output to the ADC group 150 as a pixel signal reading unit.

These operations are simultaneously performed on respective pixels on one row, for example, because the respective gates of the transfer transistor 112, the reset transistor 113, and the selecting transistor 115 are connected in units of rows.

[Configuration Example of Shared Pixel]

An example of a 2×2 pixel shared pixel configuration as shown in FIG. 2 will be described based on the above basic configuration.

Figure 4:
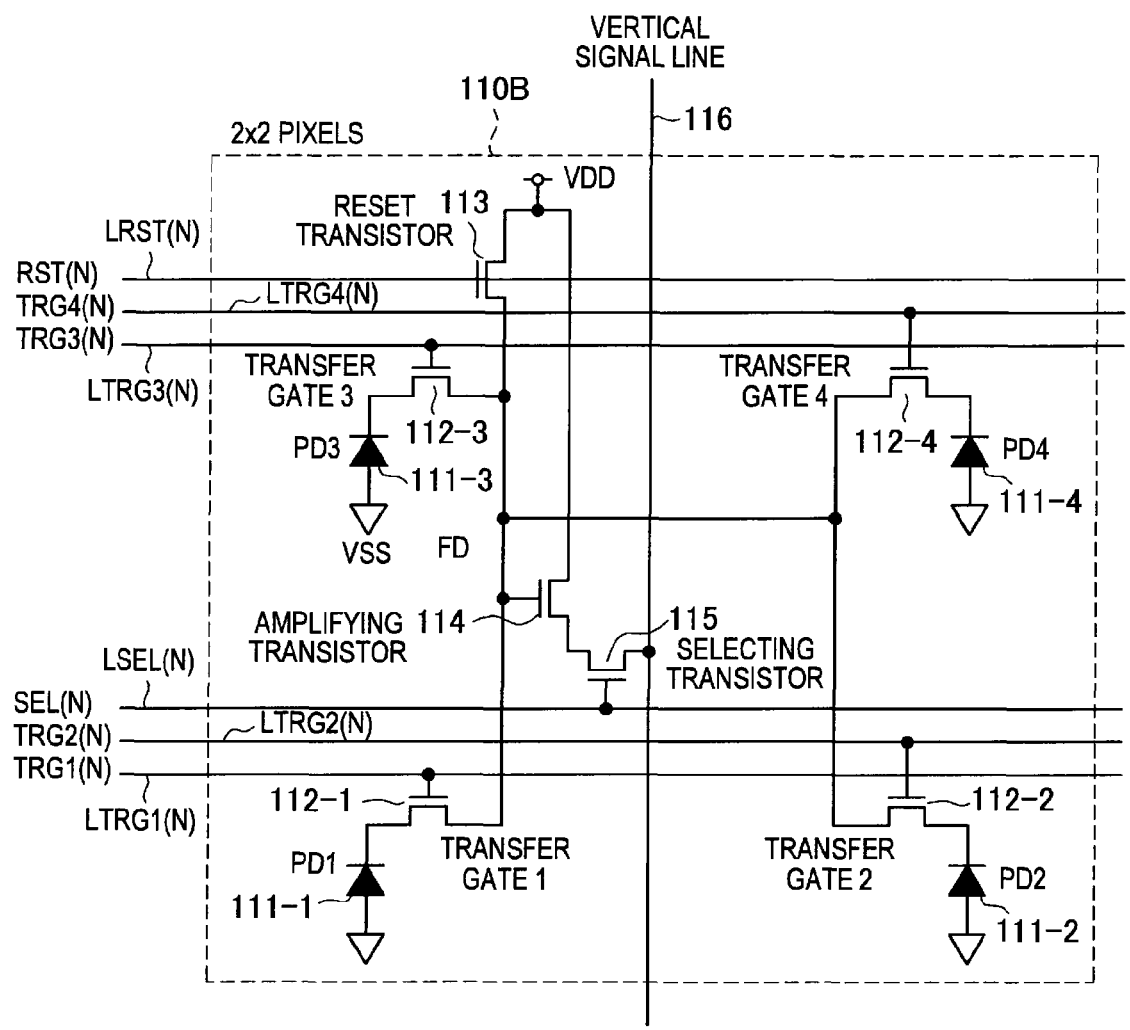
FIG. 4 is a circuit diagram showing an example of a 2×2 shared pixel configuration.

FIG. 4 is a circuit diagram showing an example of the 2×2 shared pixel configuration.

Here, a 2×2 shared pixel is indicated by a reference numeral 110B. Further, like configuration portions as in FIG. 3 are indicated by like reference numerals.

In the shared pixel 110B, pixels PXL1 to PXL4 include PDs 111-1 to 111-4, and transfer transistors 112-1 to 112-4 as transfer gates, respectively.

The shared pixel 110B includes, for the 4 pixels PXL1 to PXL4, an FD, a reset transistor 113, an amplifying transistor 114, and a selecting transistor 115.

Transfer control lines LTRG1(N) and LTRG2(N) and a select control line LSEL(N) are arranged on a row at which the pixels PXL1 and PXL2 are arranged.

Transfer control lines LTRG3(N) and LRG4(N) and a reset control line LRST (N) are arranged on a row at which the pixels PXL3 and PXL4 are arranged.

The transfer control line LRG1 is connected to a gate of a transfer transistor 112-1 of the pixel PXL1 on the first column, and the transfer control line LRG2 is connected to a gate of a transfer transistor 112-2 of the pixel PXL2 on the second column.

The transfer control line LTRG3 is connected to a gate of a transfer transistor 112-3 of the pixel PXL3 on the first column, and the transfer control line LTRG4 is connected to a gate of a transfer transistor 112-4 of the pixel PXL4 on the second column.

The select control line LSEL(N) is connected to a gate of the selecting transistor 115 and the reset control line LRST is connected to a gate of the reset transistor 113.

The transfer control lines LTRG1 to LTRG4, the reset control line LRST, and the select control line LSEL are driven by the vertical scanning circuit 130.

A vertical signal line 116 is arranged as one pixel signal read line between the pixels PXL1 and PXL3 on the first column and the pixels PXL2 and PXL4 on the second column. That is, in the pixel unit 110 of FIG. 2, one vertical signal line 116 is arranged for two columns.

The load MOS transistor 121 as a load element in the load MOS unit 120, which forms the pixel reading unit with the ADC group, is connected to the vertical signal line 116, as shown in FIG. 2.

In addition, in the ADC group 150, ADCs are arranged, one in every two columns, in parallel to correspond to such a configuration.

The load MOS transistor 121 is formed of an NMOS transistor, which is an N channel insulated gate field effect transistor.

A drain of the load MOS transistor 121 is connected to the vertical signal line 116 and a source thereof is connected to a reference potential source VSS.

A gate of each load MOS transistor 121 is connected to the supply line LVBias for the bias voltage VBias.

In the present embodiment, pixel addition is performed by source follower addition, including the load MOS transistors 121.

When charges accumulated in a plurality of pixels are added, the source follower addition is ideal when a signal amount corresponding to an average value of the added charge amounts is output to the vertical signal line 116 as a read line. However, when there is a great difference between added charge amounts, a signal amount equal to or smaller than the average value is read, such that input/output linearity is broken.

For example, when resolution of a still image is necessary, charges accumulated in each pixel are output through all-pixel driving without addition. However, when the source follower addition is driven with the bias voltage VBias that is input to the gate of the load MOS transistor 121 in all-pixel driving and if there is no difference between the two added pixel charge amounts, the output charge amounts, the output becomes a value corresponding to an average value of the added charge amounts.

However, if there is a difference between the added charge amounts, the linearity of the load MOS transistor is broken.

Thereby, the linearity of the load MOS can be enhanced by increasing the bias voltage VBias of the load MOS transistor 121, and the linearity can be guaranteed even when there is a difference between the added charge amounts. Application of colors in edges where contrast is distinct can be suppressed.

Thereby, in the present embodiment, the gate bias voltage VBias of the load MOS transistor 121 is optimized so that the linearity is maintained even when there is a great difference between the added pixel charge amounts.

That is, in the present embodiment, when the source follower addition of pixel signals of the pixels PXL in the shared pixel 110B is driven, the gate bias voltage is set to a voltage causing a current value to be higher than current upon a reference bias voltage when there is no difference between the added charge amounts.

In the solid-state imaging element 100, the timing control unit 160 for generating an internal clock, the vertical scanning circuit 130 for controlling a row address or row scan, and the horizontal transfer scanning circuit 140 for controlling a column address or column scan are arranged as a control unit for sequentially reading signals of the pixel unit 110.

The timing control unit 160 generates timing signals necessary for signal processing in the pixel unit 110, the vertical scanning circuit 130, the horizontal transfer scanning circuit 140, the ADC group (column ADC circuit) 150, the DAC 170, the signal processing circuit 190, and the line memory 200.

The pixel unit 110 photoelectrically converts a video or a screen image for each pixel row through photon accumulation and emission using a line shutter, and outputs an analog signal VSL to the ADC group.

In the ADC group 150, each ADC block (each column unit) performs an APGA-compliant integrating ADC using a ramp signal RAMP from the DAC 170, and digital CDS on an analog output of the pixel unit 110, and outputs a several-bit digital signal.

In the ADC group 150, ADCs are arranged, one for a plurality of columns and, specifically, for two columns.

Each ADC includes a comparator 151 for comparing a reference voltage Vslop, which is a ramp waveform (RAMP) obtained by changing a reference voltage generated by the DAC 170 into a step form, with an analog signal (potential VSL), which may be via the vertical signal line from pixels in each row line.

Further, each ADC includes a counter 152 for counting a comparison time, and a memory (latch) 153 for holding the result of counting.

The ADC group 150 has an n-bit digital signal conversion function and is arranged on each vertical signal line (read line), constituting a column-parallel ADC block.

An output of each latch 153 is connected to, for example, a horizontal transfer line LTRF with a 2n-bit width.

2n amplifier circuits 180 and signal processing circuits 190 corresponding to the horizontal transfer line LTRF are arranged.

In the ADC group 150, the analog signal (potential VSL) read to the vertical signal line 116 is compared with the reference voltage Vslop (ramp signal RAMP which is a slope waveform linearly changed with a certain slope) by the comparator 151 arranged in each column.

In this case, the counter 152 arranged in each column, like the comparator 151, is in operation. A certain ramp signal RAMP (potential Vslop) having a ramp waveform and a counter value are changed in one-to-one correspondence, so that the potential VSL of the vertical signal line is converted into a digital signal.

The ADC converts a change of the reference voltage Vslop (ramp signal RAMP) into a change of a time, and performs conversion into a digital value by counting such a time in a certain period (clock).

When the analog signal VSL and the ramp signal RAMP (reference voltage Vslop) intersect, the output of the comparator 151 is inverted to cease the input clock of the counter 152 or to input a clock whose input stops to the counter 152, completing the AD conversion.

After such an AD conversion period ends, data held in the memory (latch) 153 is transferred to the horizontal transfer line LTRF by the horizontal transfer scanning circuit 140 and input to the signal processing circuit 190 via the amplifier 180, such that a two-dimensional image is generated by given signal processing.

The horizontal transfer scanning circuit 140 performs simultaneous parallel transfer of several channels to secure a transfer rate.

The timing control unit 160 generates timing necessary for signal processing in the respective blocks, such as the pixel unit 110 and the ADC group 150.

The signal processing circuit 190 at a subsequent stage performs correction of a vertical line defect or a point defect and clamp of a signal from the signal stored in the line memory 200, or performs digital signal processing, such as parallel-serial conversion, compression, coding, addition, averaging, and intermittent operation.

A digital signal transmitted to each pixel row is stored in the line memory 200.

In the solid-state imaging element 100 of the present embodiment, the digital output of the signal processing circuit 190 is transmitted as an input of an ISP or a baseband LSI.

Next, driving source follower addition in the first embodiment will be described with reference to FIGS. 5 and 6.

Figure 5:
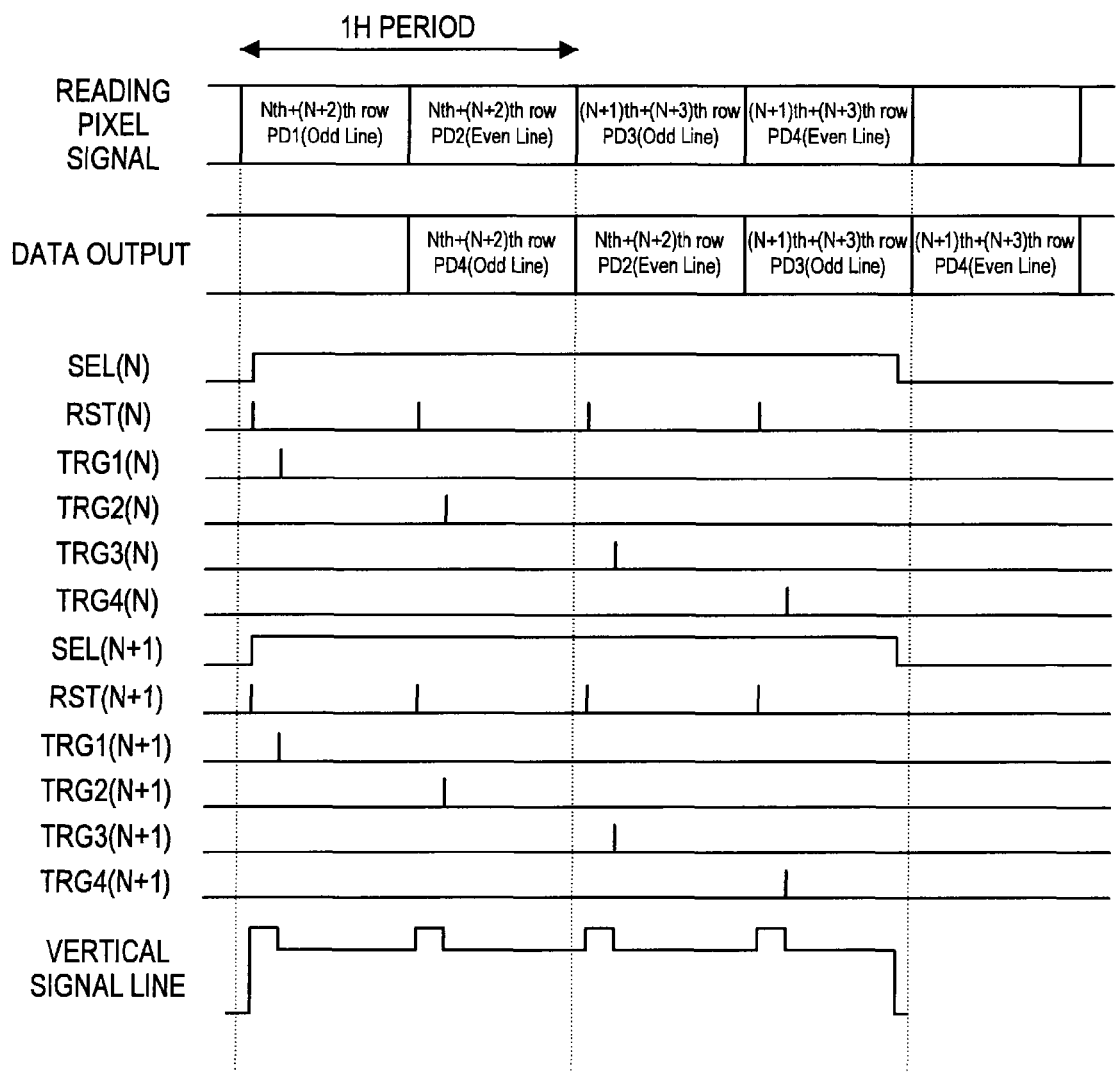
FIG. 5 is a diagram showing a timing chart of driving of source follower addition of the first embodiment.

FIG. 5 is a diagram showing a timing chart of driving of source follower addition of the first embodiment.

After the select signals SEL(N) and SEL(N+1) are made at a high level, the reset signals RST(N) and RST(N+1) are made at a high level to reset the FD so that AD conversion at a reset level (P phase) is performed.

Thereafter, the transfer signals TRG1(N) and TRG1(N+1) are made at a high level to simultaneously read signals of the PDs 111-1(PD1) on rows N and N+2 and perform AD conversion at a signal level (D phase). A signal of a difference between the P phase and the D phase is held in the memory 153.

Next, the reset signals RST(N) and RST(N+1) are made at a high level to reset the FD so that AD conversion of the P phase is performed. The transfer signals TRG2(N) and TRG2(N+1) are made at a high level to read a signal of the PD 11102(PD2) so that AD conversion of the D phase is performed.

For output of data of the PD, data of the PD 111-1(PD1) is output while the AD conversion process in the PD 111-2(PD2) is being performed.

Similarly, AD conversion and data output in the PDs 111-3(PD3) and 111-4(PD4) are performed.

Figure 6:
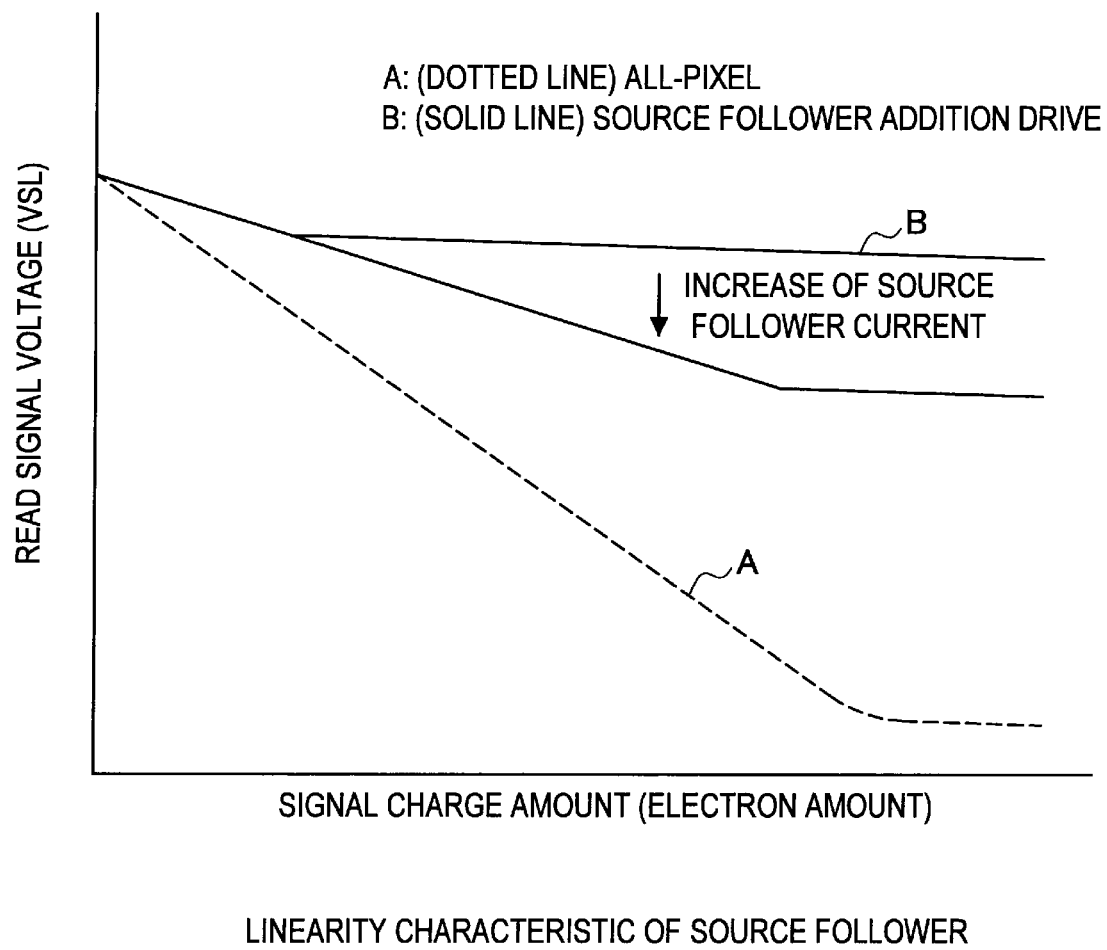
FIG. 6 is a diagram showing a linearity characteristic of a source follower of the first embodiment.

FIG. 6 is a diagram showing a linearity characteristic of the source follower of the first embodiment.

In FIG. 6, a horizontal axis indicates a signal charge amount (electron amount) and a vertical axis indicates a read signal voltage (VSL). Further, in FIG. 6, a curve (dotted line) indicated by A shows an all-pixel drive characteristic, and a curve (solid line) indicated by B shows a source follower addition drive characteristic.

In still image photographing that emphasizes, for example, resolution, all-pixel driving may be used and a current value flowing in the load MOS transistor 121 at that time may be determined from the perspective of consumption current and input/output linearity of the source follower.

However, when the source follower addition is performed with current of the load MOS transistor 121 having the same value as in all-pixel driving, the linearity of the source follower is broken with the increasing difference between the added pixel charge amounts, and false colors are generated in areas, such as edges, where contrast is distinct.

On the other hand, in the present embodiment, the bias voltage VBias of the load MOS transistor 121 is higher than a normal voltage and current flowing in the load MOS transistor 121 increases, thereby extending a range in which the linearity of the source follower is maintained.

Thereby, even when the difference between the added pixel charge amounts is great, the read signal amount becomes a signal amount corresponding to an average value of the added charge amounts.

That is, false color at edges caused by the source follower addition can be suppressed.

<2. Second Embodiment>

Figure 7:
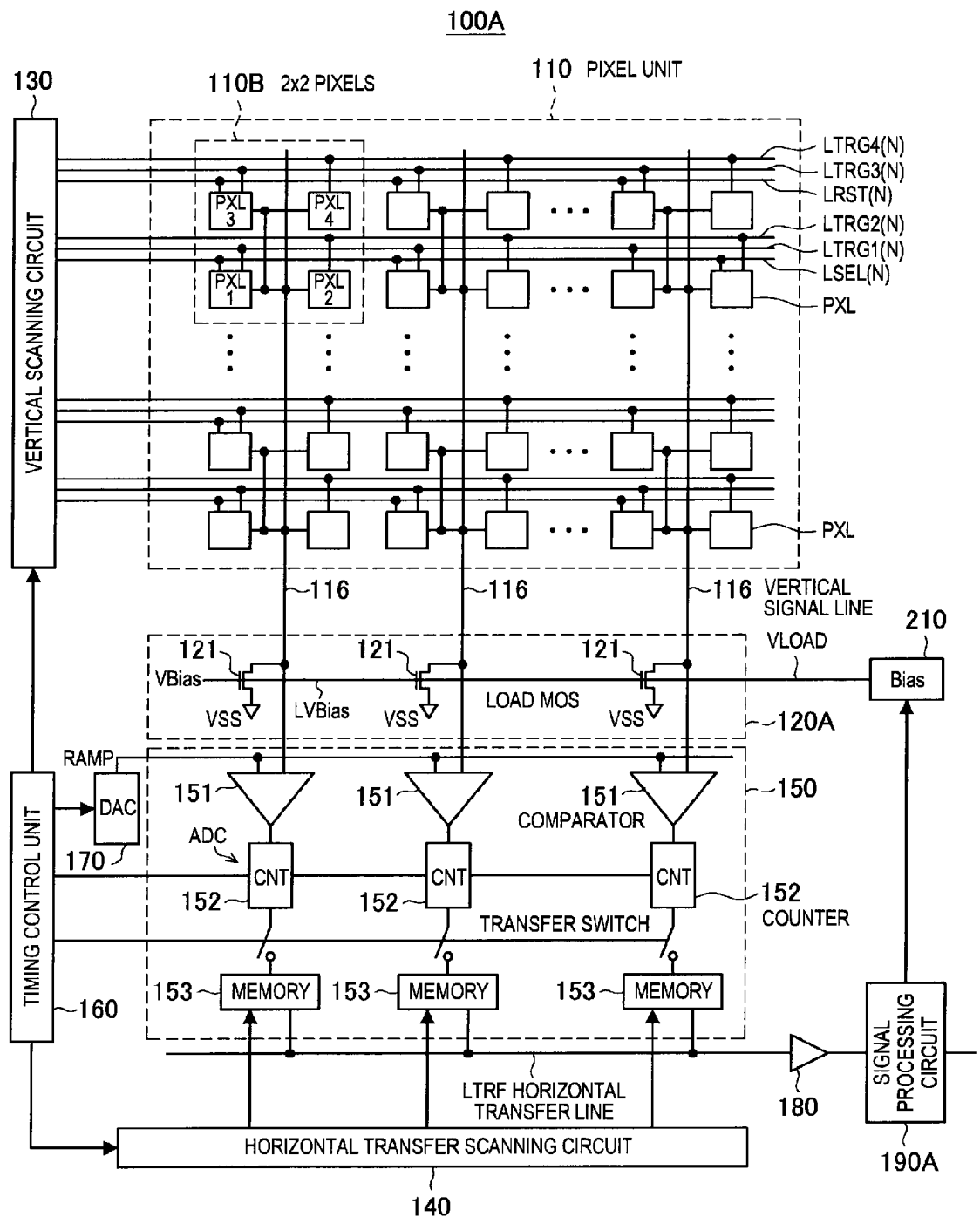
FIG. 7 is a block diagram showing a configuration example of a solid-state imaging element (CMOS image sensor) with a column-parallel ADC according to a second embodiment of the present invention.

FIG. 7 is a block diagram showing a configuration example of a solid-state imaging element (CMOS image sensor) with a column-parallel ADC according to a second embodiment of the present invention.

The solid-state imaging element 100A according to the second embodiment differs from the solid-state imaging element 100 according to the first embodiment in that the solid-state imaging element 100A is configured to independently control the gate voltage of the load MOS transistor 121 for reading of each pixel.

Thus, in the solid-state imaging element 100A, a method of reducing power consumption by adjusting, in each pixel, the current flowing in the load MOS transistor for reading of each pixel in source follower addition drive is adopted.

In the solid-state imaging element 100A of the second embodiment, a signal processing circuit 190A as a signal processing unit has a calculation function, and a control signal CTL is output to a bias control unit 210 according to the calculation result.

The bias control unit 210 dynamically changes the bias voltage VBias of the load MOS transistor 121 with a voltage VLOAD to adjust the current of the load MOS transistor.

Hereinafter, a bias voltage control function of this solid-state imaging element 100A will be described.

Figure 8:
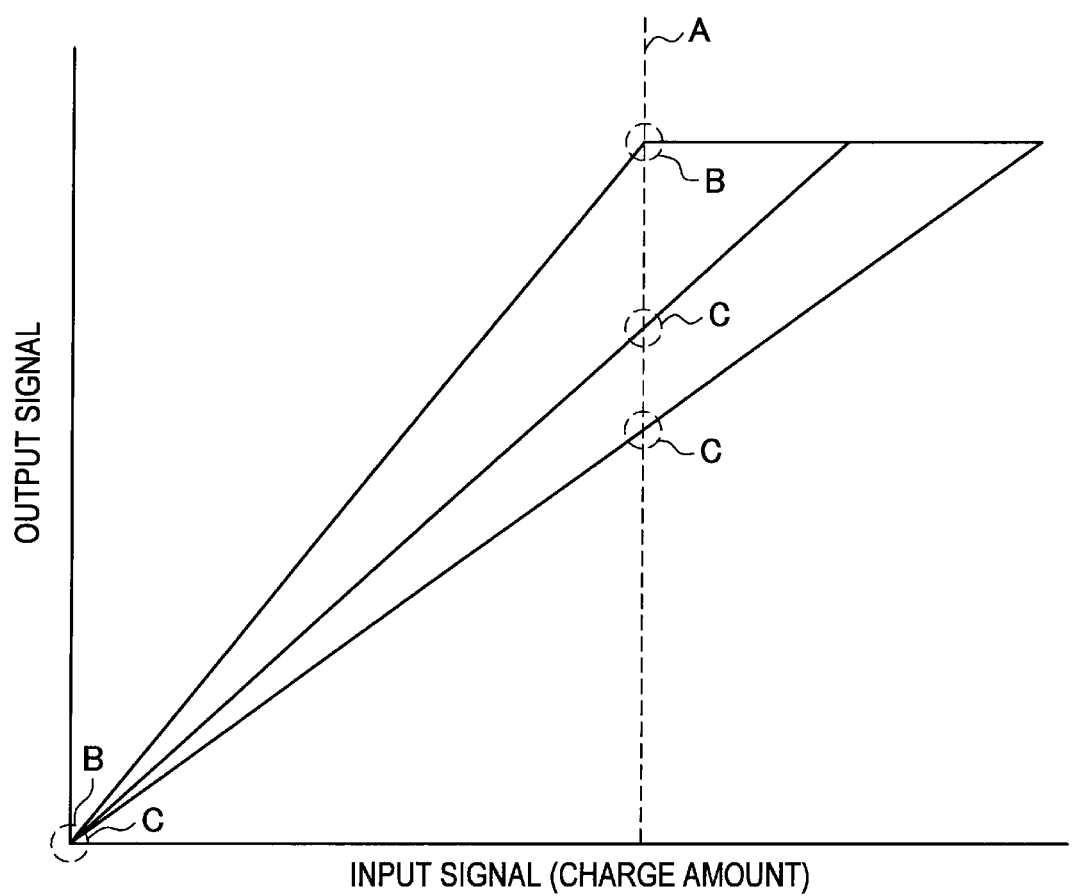
FIG. 8 is a diagram for explaining an RGB input/output linearity characteristic of the solid-state imaging element according to the second embodiment.

FIG. 8 is a diagram for explaining an RGB input/output linearity characteristic of the solid-state imaging element according to the second embodiment.

As indicated by A in FIG. 8, in a single-chip CMOS image sensor in which a shutter is pressed uniformly for RGB, an RGB accumulation time is cut at a time when any pixel is saturated and no overexposure occurs.

Thereby, as indicated by B in FIG. 8, an accumulated charge amount near saturation being added to an accumulated charge amount upon darkness in the source follower addition is a condition in which accumulated charge amounts having a maximum difference therebetween are added.

Since the RGB sensitivity ratio is seen from the pixel characteristic, a maximum difference between source-follower-added charge amounts for the RGB pixels can also be calculated, as indicated by C in FIG. 5.

Accordingly, current flowing in the load MOS transistor 121 upon source follower addition can be optimized for each color, thereby reducing power consumption.

FIGS. 9A to 12B are diagrams showing another method for driving source follower addition in a pixel array including a different shared pixel.

Figure 9A:
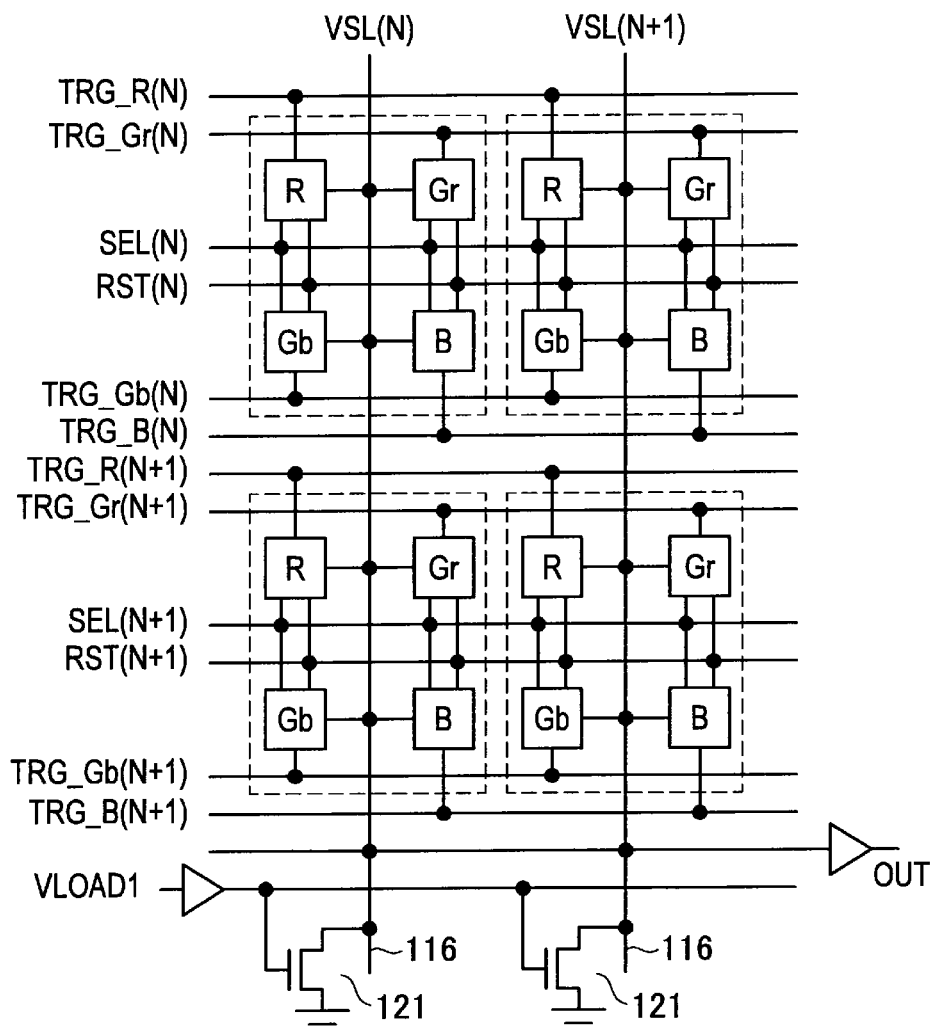
FIG. 9A is a diagram for explaining a first method of driving source follower addition of the second embodiment, which is a method of driving source follower addition in a 2×2 pixel shared pixel array.
Figure 9B:
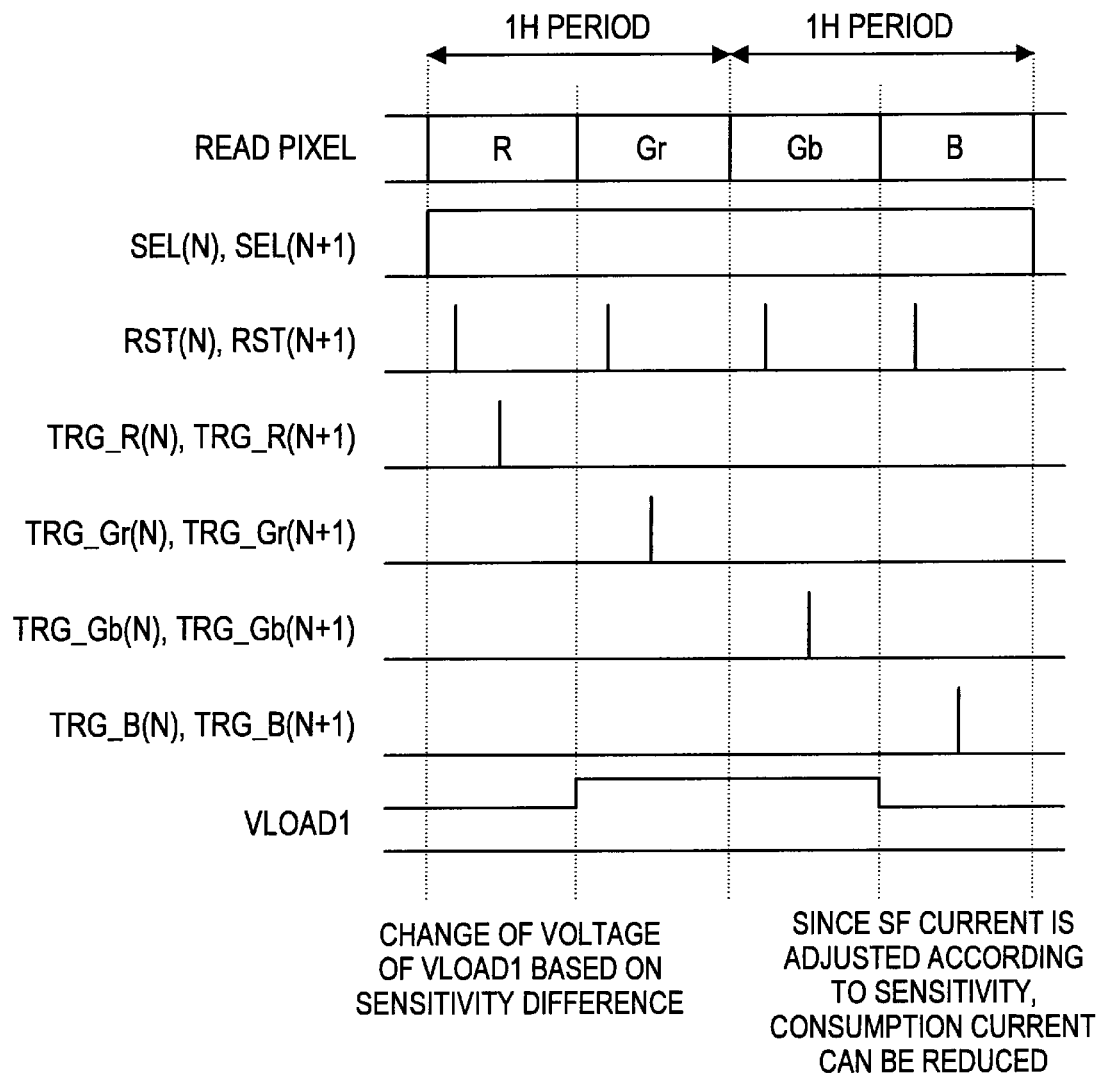
FIG. 9B is a diagram for explaining the first method of driving source follower addition of the second embodiment, which is a method of driving source follower addition in a 2×2 pixel shared pixel array.

FIGS. 9A and 9B are diagrams for explaining a first method of driving source follower addition of the second embodiment, which is a method of driving source follower addition in a 2×2 pixel shared pixel array. FIG. 9A is an equivalent circuit diagram and FIG. 9B shows a timing chart.

Figure 10A:
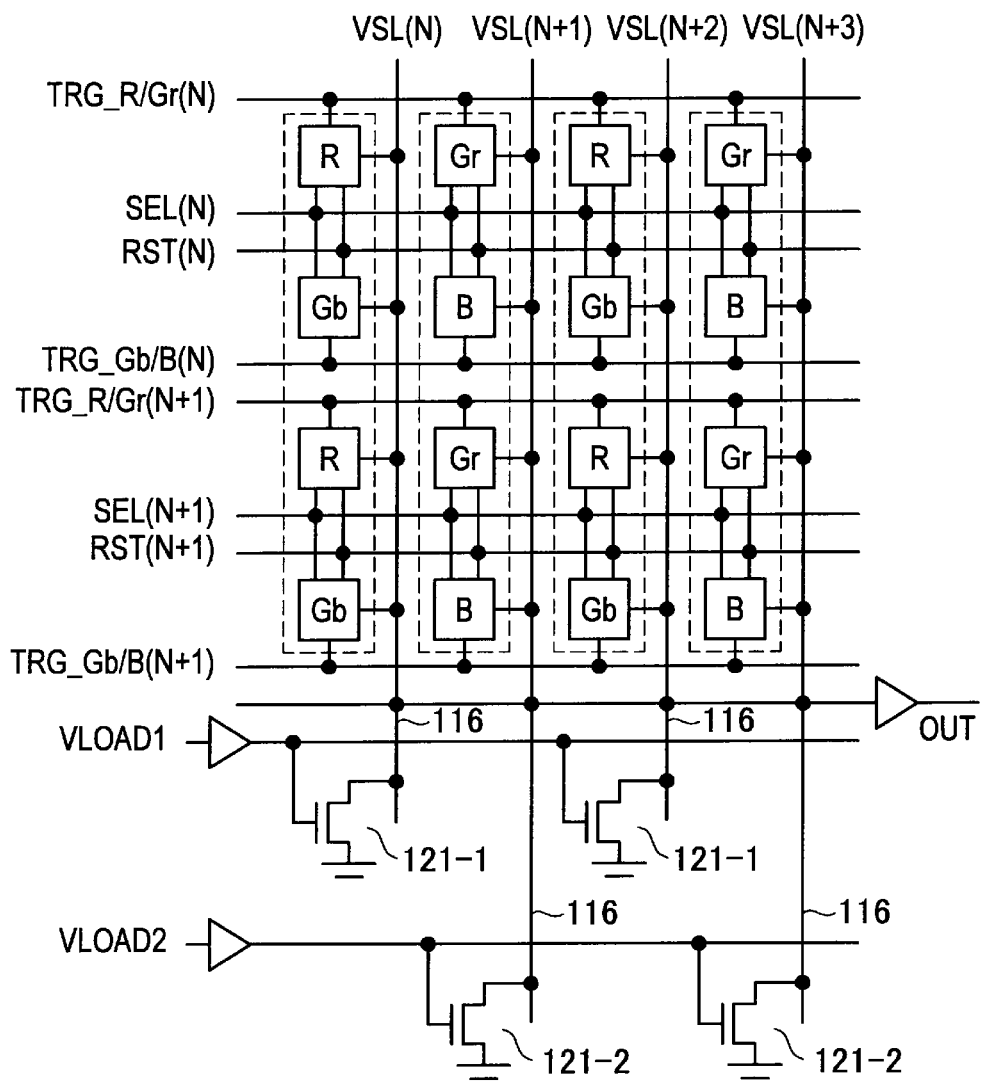
FIG. 10A is a diagram for explaining a second method of driving source follower addition of the second embodiment, which is a method of driving source follower addition in a 4×1 pixel shared pixel array.
Figure 10B:
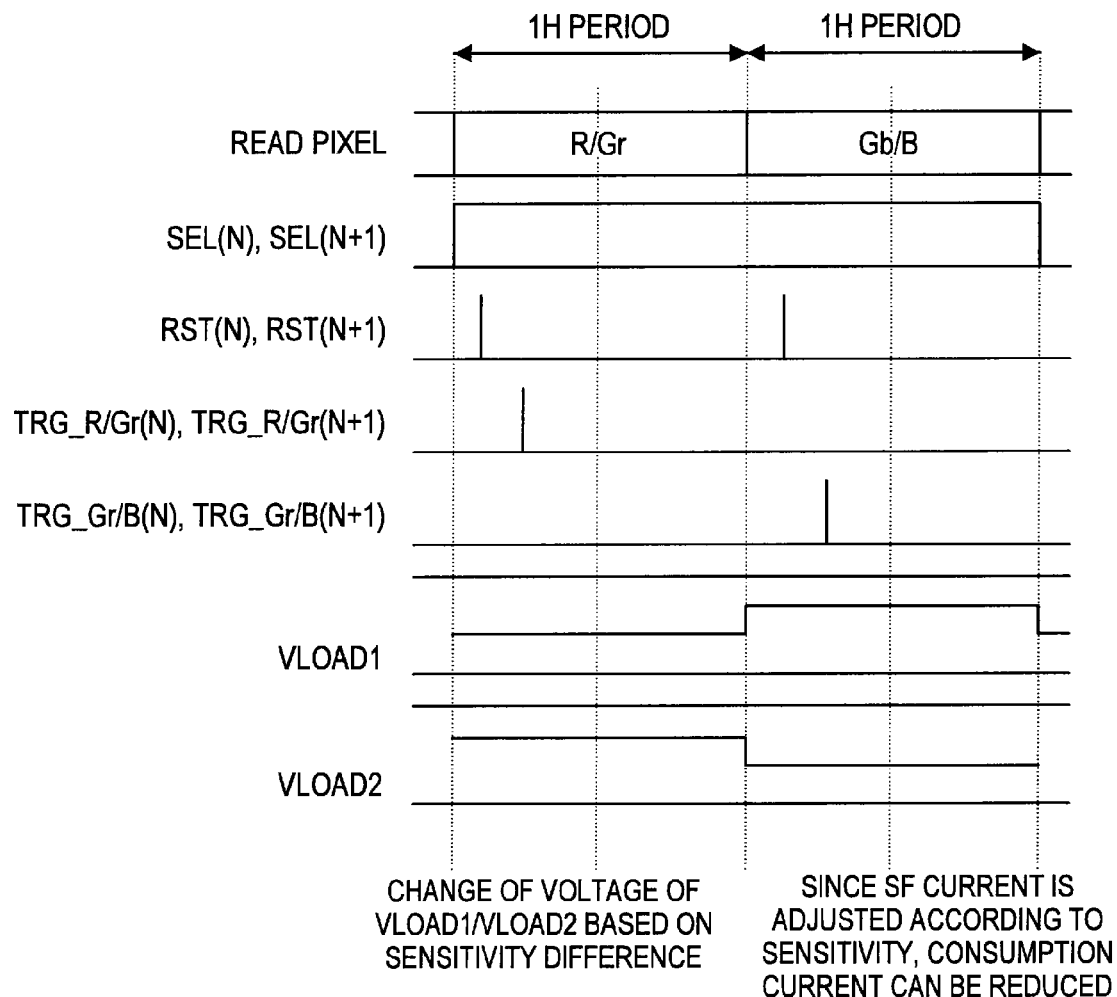
FIG. 10B is a diagram for explaining the second method of driving source follower addition of the second embodiment, which is a method of driving source follower addition in a 4×1 pixel shared pixel array.

FIGS. 10A and 10B are diagrams for explaining a second method of driving source follower addition of the second embodiment, which is a method of driving source follower addition in a 4×1 pixel shared pixel array. FIG. 10A is an equivalent circuit diagram and FIG. 10B shows a timing chart.

Figure 11A:
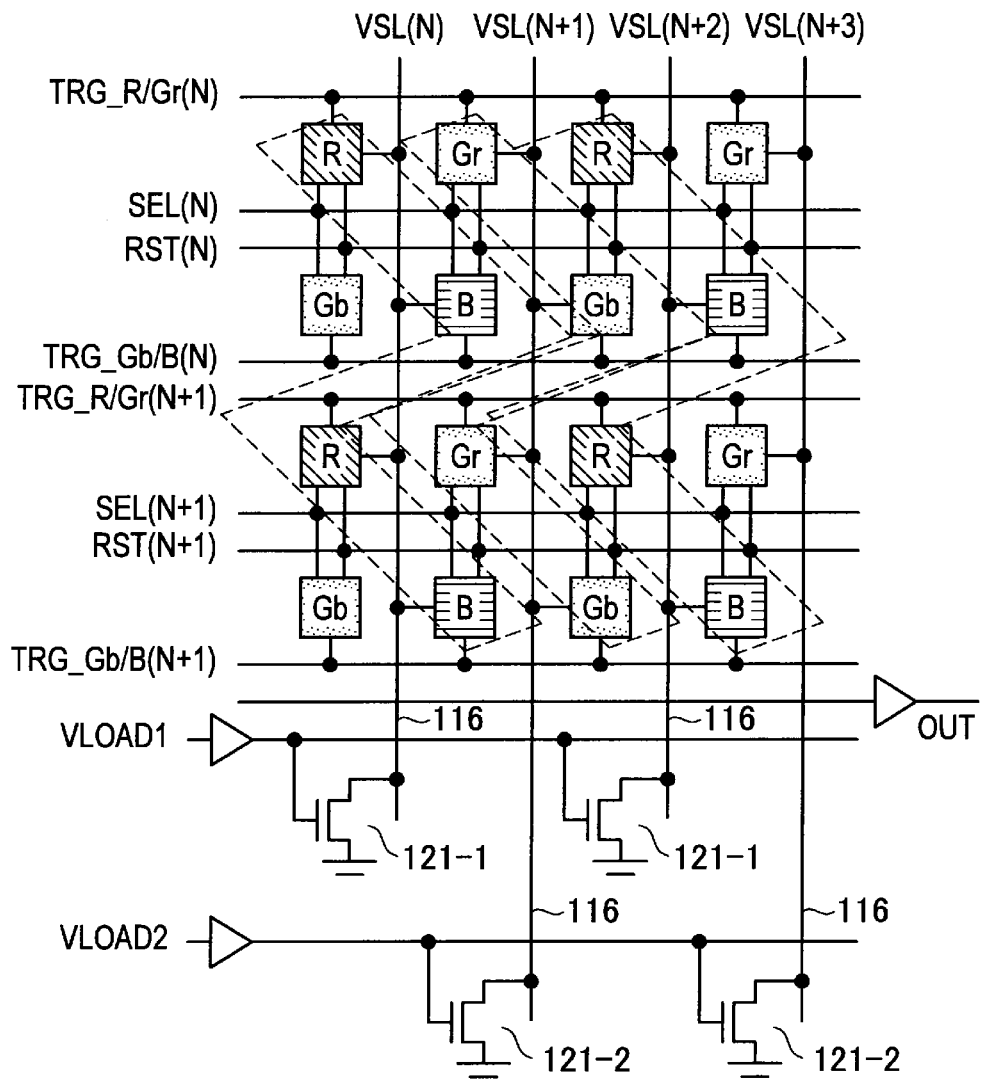
FIG. 11A is a diagram for explaining a third method of driving source follower addition of the second embodiment, which is a method of driving source follower addition in a 2×2 pixels zigzag pixel shared pixel array.

FIGS. 11A and 11B are diagrams for explaining a third method of driving source follower addition of the second embodiment, which is a method of driving source follower addition in a 2×2 pixels zigzag pixel shared pixel array. FIG. 11A is an equivalent circuit diagram and FIG. 11B shows a timing chart.

FIGS. 12A and 12B are diagrams for explaining a fourth method of driving source follower addition of the second embodiment, which is a method of driving source follower addition in the same color 2×2 pixel shared pixel array. FIG. 12A is an equivalent circuit diagram and FIG. 12B shows a timing chart.

In FIGS. 9A to 12B, a voltage applied to a gate of a load MOS transistor 121 is shown as VLOAD.

In the first example of FIGS. 9A and 9B, the gate voltage of the load MOS transistor 121 is controlled with one voltage VLOAD1.

In the second to fourth examples of FIGS. 10A to 12B, a gate voltage of a load MOS transistor 121-1 is controlled with a voltage VLOAD1 and a gate voltage of a load MOS transistor 121-2 is controlled with a voltage VLOAD2.

In any of the four examples, the voltage VLOAD1 or VLOAD2 to be applied to the gate of the load MOS transistor 121 is adjusted according to a sensitivity ratio upon column-parallel reading, thereby reducing power consumption.

As one example, when white light is incident to an image sensor in which a Gr/Gb pixel among RGB pixels has the highest sensitivity, the following occurs.

When the Gr/Gb pixel is read, the voltage applied to the gate of the load MOS transistor 121 is 1 V and when R/B pixel is read, the voltage applied to the gate of the load MOS transistor 121 is changed to 0.8 V, leading to reduced consumption current.

Further, when a light amount is not saturated even though 1 frame has been accumulated, a difference between charge amounts added by source follower addition is further reduced, making it possible to reduce current flowing in the load MOS transistor 121.

For example, the arithmetic processing circuit compares an output of a pixel of each color in 1 frame with an output of a pixel of the same color that is subsequently output, and stores a greater output value in the memory of the signal processing circuit 190A.

Similarly, through comparison for each color, a maximum output value for each color in the 1 frame is stored in the memory.

After the 1 frame ends, an amount of charges maximally accumulated in the pixel can be supposed from the values stored in the memory of the arithmetic processing circuit and an analog gain value or a digital gain value of a sensor. When the amount of the charges supposed to be maximally accumulated and a pixel upon darkness are added, the maximum load MOS current needs to flow.

Since it is preferable for the linearity of the load MOS transistor 121 to be maintained in the above condition, the current flowing in the load MOS transistor 121 can be further reduced.

Hereinafter, the above-described content will be described in detail in connection with a single-chip image sensor of an RGB Bayer arrangement for column-parallel reading of a 10-bit output as one example.

When pixels are read, an R pixel on a first column is first read.

A maximum output value in the read R pixel is held in the memory of the signal processing circuit 190A.

Next, a read maximum output value of a Gr pixel on the same column is held in the memory of the signal processing circuit 190A. A maximum value of a Gb pixel/B pixel is held in the memory of the signal processing circuit 190A, as in the R pixel/Gr pixel.

The same process is performed on the entire 1 frame.

After the 1 frame ends, the values of the memory in the signal processing circuit 190A are as follows: R pixel=512, Gr pixel=768, Gb pixel=768, and B pixel=256.

Further, an analog gain is αdB. When a digital gain is applied before an output value is held in the memory of the signal processing circuit 190A, the gain value is βdB.

A maximum difference that is likely to be between two signal amounts in each color added by the source follower becomes a charge amount calculated by a charge amount upon darkness and the following equation.

[Equation 1]
$$\text{charge amount} = \frac{\text{maximum value of memory in calculation process}}{10^{\frac{\alpha}{20}} * 10^{\frac{\beta}{20}} * 2} * LSB \text{ value/conversion efficiency}$$

From the foregoing, a range in which the linearity needs to be maintained upon source follower addition can be recognized.

The value is one example. For example, it can be configured to have a table as shown in FIG. 13 in the signal processing circuit 190A.

For example, a digital value corresponding to a voltage necessary to apply an applied voltage, which is necessary for maintaining the linearity when each color is read from the signal processing circuit 190A to the bias control unit 210, is fed back.

FIG. 13 is a diagram showing a relationship among a difference between added charge amounts, the gate voltage of the load MOS transistor necessary for linearity maintenance, and the control value.

The difference between the added charge amounts is calculated, for example, by the signal processing circuit 190A.

When the difference between the added charge amounts is "0," the voltage VLOAD applied to the gate of the load MOS transistor 121 is 0.60 V.

In this case, the signal processing circuit 190A outputs the control signal CTL of a control value 0 to the bias control unit 210.

Accordingly, the bias control unit 210 adjusts the voltage VLOAD applied to the gate of the load MOS transistor 121 to 0.60 V in response to the control value 0.

When the difference between the added charge amounts is "200," the voltage VLOAD applied to the gate of the load MOS transistor 121 is 0.65 V.

In this case, the signal processing circuit 190A outputs the control signal CTL of a control value 1 to the bias control unit 210.

Accordingly, the bias control unit 210 adjusts the voltage VLOAD applied to the gate of the load MOS transistor 121 to 0.65 V in response to the control value 1.

When the difference between the added charge amounts is "400," the voltage VLOAD applied to the gate of the load MOS transistor 121 is 0.70 V.

In this case, the signal processing circuit 190A outputs the control signal CTL of a control value 2 to the bias control unit 210.

Accordingly, the bias control unit 210 adjusts the voltage VLOAD applied to the gate of the load MOS transistor 121 to 0.70 V in response to the control value 2.

When the difference between added charge amounts is "600," the voltage VLOAD applied to the gate of the load MOS transistor 121 is 0.75 V.

In this case, the signal processing circuit 190A outputs the control signal CTL of a control value 3 to the bias control unit 210.

Accordingly, the bias control unit 210 adjusts the voltage VLOAD applied to the gate of the load MOS transistor 121 to 0.75V in response to the control value 3.

When the difference between the added charge amounts is "800," the voltage VLOAD applied to the gate of the load MOS transistor 121 is 0.80 V.

In this case, the signal processing circuit 190A outputs the control signal CTL of a control value 4 to the bias control unit 210.

Accordingly, the bias control unit 210 adjusts the voltage VLOAD applied to the gate of the load MOS transistor 121 to 0.80 V in response to the control value 4.

When the difference between the added charge amounts is "1000," the voltage VLOAD applied to the gate of the load MOS transistor 121 is 0.85 V.

In this case, the signal processing circuit 190A outputs the control signal CTL of a control value 5 to the bias control unit 210.

Accordingly, the bias control unit 210 adjusts the voltage VLOAD applied to the gate of the load MOS transistor 121 to 0.85 V in response to the control value 5.

When the difference between the added charge amounts is "1200," the voltage VLOAD applied to the gate of the load MOS transistor 121 is 0.90 V.

In this case, the signal processing circuit 190A outputs the control signal CTL of a control value 6 to the bias control unit 210.

Accordingly, the bias control unit 210 adjusts the voltage VLOAD applied to the gate of the load MOS transistor 121 to 0.90 V in response to the control value 6.

When the difference between the added charge amounts is "1400," the voltage VLOAD applied to the gate of the load MOS transistor 121 is 0.95 V. In this case, the signal processing circuit 190A outputs the control signal CTL of a control value 7 to the bias control unit 210.

Accordingly, the bias control unit 210 adjusts the voltage VLOAD applied to the gate of the load MOS transistor 121 to 0.95 V in response to the control value 7.

When the difference between the added charge amounts is "1600," the voltage VLOAD applied to the gate of the load MOS transistor 121 is 1.00 V.

In this case, the signal processing circuit 190A outputs the control signal CTL of a control value 8 to the bias control unit 210.

Accordingly, the bias control unit 210 adjusts the voltage VLOAD applied to the gate of the load MOS transistor 121 to 1.00 V in response to the control value 8.

As described above, according to the present embodiment, the solid-state imaging element includes the pixel unit 110 in which the plurality of pixels that perform photoelectric conversion are arranged in a matrix form, and the pixel signal reading unit (ADC group) 150 for reading data from the pixel unit 110 in units of rows.

In the pixel unit 110, a plurality of pixels share the FD (output node), the reset transistor 113, the amplifying transistor 114, and the selecting transistor 115. Each pixel in the shared pixel includes a PD 111 and a transfer transistor 112.

The vertical signal line 116 as the read signal line is arranged, one for the columns in which the shared pixel is included. A load MOS transistor 121 for driving source follower addition, which forms a pixel reading unit in cooperation with the ADC group 150, is connected to the vertical signal line 116.

The gate voltage of the load MOS transistor 121 is higher than a reference gate voltage when there is no difference between the added charge amounts, to increase the current of the source follower and extend the linearity characteristic when the source follower addition is driven.

Alternatively, a method of reducing power consumption by adjusting the current flowing in the load MOS transistor using each pixel for reading of each pixel in driving the source follower addition is adopted.

The ADC group 150 includes a plurality of comparators 151 arranged to correspond to a column arrangement of pixels, for comparing a read signal potential with a reference voltage for judgment and outputting a judgment signal, a plurality of counters 152 each for counting a comparison time of a corresponding one of the comparators, and memories 153.

Thus, according to the present embodiment, the following advantageous effects can be obtained.

In general, in a CMOS image sensor, when a unit cell size of a pixel becomes small due to multiple pixels and miniaturization, degradation of sensitivity or S/N is not avoided and a driving method of adding pixel outputs in an analog or digital manner is indispensable.

As described above, one adding method is the source follower addition in which the addition is performed by the load MOS connected to the read signal line.

When resolution is necessary, for example, in a still image, charges accumulated in each pixel are output by all-pixel driving without the addition.

However, when the source follower addition is driven with a bias voltage that is input to the gate of the load MOS upon all-pixel driving and if there is no difference between the two added pixel charge amounts, the output becomes a value corresponding to the average value of the added charge amounts. However, if there is a difference between the added charge amounts, the linearity of the load MOS transistor is broken.

According to the present embodiment, the linearity of the load MOS transistor can be enhanced by increasing the bias voltage of the load MOS transistor, and the linearity can be guaranteed even when there is a difference between the added charge amounts, thereby suppressing application of colors, for example, at edges where contrast is distinct.

Further, the current flowing in the load MOS transistor when each color is read is optimized according to the incident light amount and the RGB sensitivity ratio, thereby reducing power consumption.

For example, conditions in which the difference between the added charge amounts is maximized are darkness, and when pixels in which the FD is completely filled are added. However, even when the 1 frame is accumulated, a maximum difference is reduced in a light amount in which a shutter need not be pressed.

Thereby, the range in which the linearity of the load MOS transistor is maintained can be reduced and consumption current can be accordingly reduced.

The solid-state imaging element having such advantageous effects may be applied as an imaging device for a digital camera or a video camera.

3. Third Embodiment
[Example of Configuration of Camera System]

Figure 14:
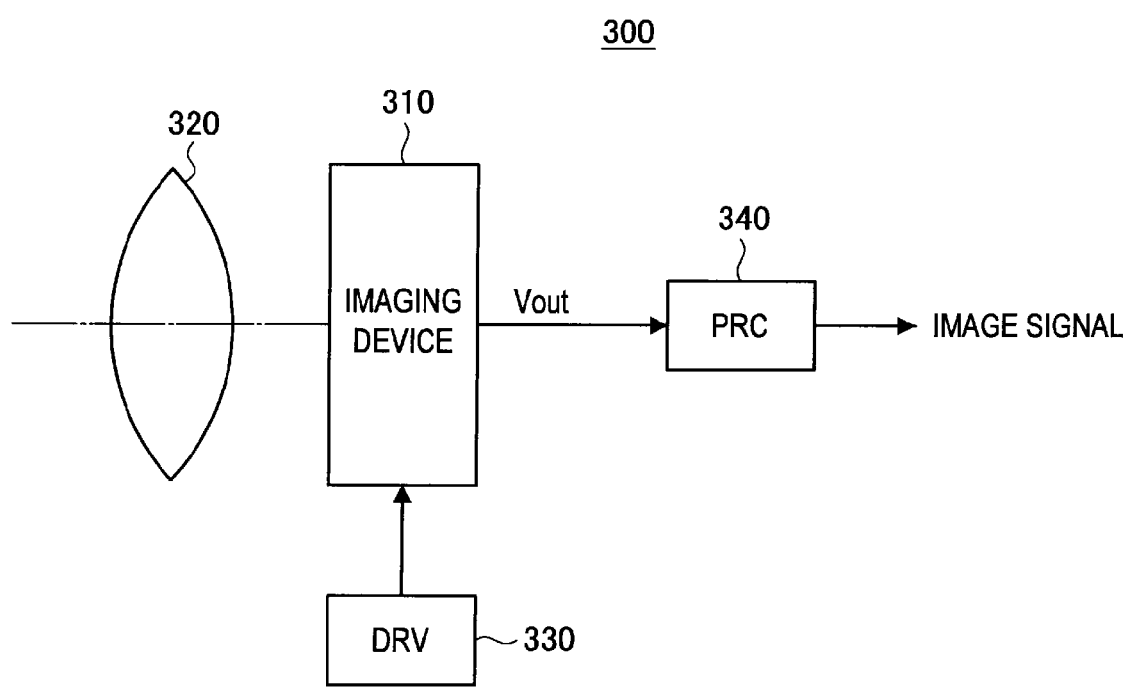
FIG. 14 is a diagram showing one example of a configuration of a camera system to which a solid-state imaging element according to a third embodiment of the present invention is applied.

FIG. 14 is a diagram showing one example of a configuration of a camera system to which a solid-state imaging element according to a third embodiment of the present invention is applied.

This camera system 300 includes an imaging device 310 to which the CMOS image sensor (solid-state imaging element) 100 or 100A according to the present embodiment is capable of being applied, as shown in FIG. 14.

The camera system 300 includes an optical system for guiding incident light to a pixel area of the imaging device 310 (for imaging a subject image), such as a lens 320 for imaging the incident light (image light) on an imaging surface.

The camera system 300 includes a driving circuit (DRV) 330 for driving the imaging device 310, and a signal processing circuit (PRC) 340 for processing an output signal of the imaging device 310.

The driving circuit 330 includes a timing generator (not shown) for generating various timing signals including a start pulse or a clock pulse to drive a circuit in the imaging device 310, and drives the imaging device 310 using a given timing signal.

Further, the signal processing circuit 340 performs given signal processing on the output signal of the imaging device 310.

An image signal processed by the signal processing circuit 340 is recorded, for example, in a recording medium, such as a memory.

Image information recorded in the recording medium is hard copied by, for example, a printer. Further, the image signal processed by the signal processing circuit 340 is output as a moving image on a monitor configured of a liquid crystal display.

As described above, in an imaging apparatus such as a digital still camera, the above-described solid-state imaging element 100 or 100A is mounted as the imaging device 310, thereby realizing a precise camera.

REFERENCE SIGNS LIST 100 solid-state imaging element
110 pixel unit
120 load MOS unit
130 vertical scanning circuit
140 horizontal transfer scanning circuit
150 ADC group
151 comparator
152 counter
153 latch
160 timing control unit
170 DAC
180 amplifier circuit
190, 190A signal processing circuit
200 line memory
210 bias control unit
LTRF horizontal transfer line
300 camera system
310 imaging device
320 driving circuit
330 lens
340 signal processing circuit

What is claimed:

1. An imaging device comprising:
a pixel unit including a first pixel and a second pixel;
a first signal line connected to an output of the first pixel;
a second signal line different from the first signal line connected to an output of the second pixel;
a first load transistor connected to the first signal line at an output of the first signal line from the pixel unit;
a second load transistor connected to the second signal line at an output of second signal line from the pixel unit;
a first control line;
a second control line different from the first control line; and
a source of one or more bias voltages connected to a gate of the first load transistor through the first control line and to a gate of the second load transistor through the second control line.

2. The imaging device according to claim 1, wherein:
the first control line is configured to supply a first voltage to the gate of the first load transistor, and
the second control line is configured to supply a second voltage to the gate of the second load transistor.

3. An imaging device comprising:
a pixel unit including first, second, third, and fourth sub-arrays, each sub-array including four pixels arranged in a 2×2 matrix,
a first signal line connected to outputs of the first sub-array and the third sub-array;
a first load transistor connected to a first signal line at an output of the first signal line from the pixel unit;
a second signal line different from the first signal line and connected to outputs of the second sub-array and the fourth sub-array;
a second load transistor connected to the second signal line at an output of the second signal line from the pixel unit;
a first control line;
a second control line different from the first control line; and
a source of one or more bias voltages connected to a gate of the first load transistor through the first control line and to a gate of the second load transistor through the second control line,
wherein,
the first sub-array includes a red-light-transmitting filter,
each of the second and the third sub-array includes a green-light-transmitting filter,
the fourth sub-array includes a blue-light-transmitting filter,
the first sub-array is disposed diagonally to the fourth sub-array, and
the second sub-array is disposed diagonally to the third sub-array.

4. The imaging device according to claim 3, wherein:
the first control line is configured to supply a first voltage to the gate of the first load transistor, and
the second control line is configured to supply a second voltage to the gate of the second load transistor.

* * * * *